United States Patent
Leobandung

(10) Patent No.: US 9,048,318 B2
(45) Date of Patent: Jun. 2, 2015

(54) DUAL MATERIAL FINFET ON SAME SUBSTRATE

(71) Applicant: International Business Machines Corporation, Armonk, NY (US)

(72) Inventor: Effendi Leobandung, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/027,591

(22) Filed: Sep. 16, 2013

(65) Prior Publication Data

US 2014/0327045 A1    Nov. 6, 2014

Related U.S. Application Data

(63) Continuation of application No. 13/887,766, filed on May 6, 2013, now Pat. No. 8,859,355.

(51) Int. Cl.

| | |
|---|---|
| H01L 29/66 | (2006.01) |
| H01L 27/088 | (2006.01) |
| H01L 29/78 | (2006.01) |
| H01L 21/84 | (2006.01) |
| H01L 27/12 | (2006.01) |
| H01L 21/8234 | (2006.01) |
| H01L 21/8238 | (2006.01) |
| H01L 27/092 | (2006.01) |
| H01L 27/108 | (2006.01) |
| H01L 29/417 | (2006.01) |

(52) U.S. Cl.
CPC ........ *H01L 29/785* (2013.01); *H01L 29/66795* (2013.01); *H01L 21/823431* (2013.01); *H01L 21/823821* (2013.01); *H01L 27/0886* (2013.01); *H01L 27/0924* (2013.01); *H01L 27/10826* (2013.01); *H01L 27/10879* (2013.01); *H01L 29/41791* (2013.01); *H01L 21/845* (2013.01); *H01L 27/1211* (2013.01)

(58) Field of Classification Search
CPC ............... H01L 21/845; H01L 21/823431; H01L 21/823821; H01L 27/0886; H01L 27/0924; H01L 27/10826; H01L 27/10879; H01L 27/1211; H01L 29/41791; H01L 29/66795; H01L 29/785
USPC ........................ 257/328, 331, 401, E29.089
See application file for complete search history.

(56) References Cited

U.S. PATENT DOCUMENTS

| | | | | |
|---|---|---|---|---|
| 6,794,718 | B2 * | 9/2004 | Nowak et al. | 257/347 |
| 7,625,790 | B2 * | 12/2009 | Yang | 438/198 |
| 7,659,157 | B2 * | 2/2010 | Greene et al. | 438/199 |
| 8,183,104 | B2 | 5/2012 | Hobbs et al. | |
| 8,183,627 | B2 * | 5/2012 | Currie | 257/329 |

(Continued)

*Primary Examiner* — Ida M Soward
(74) *Attorney, Agent, or Firm* — Scully, Scott, Murphy & Presser, P.C.; Louis J. Percello, Esq.

(57) ABSTRACT

A method of fabricating a semiconductor device including proving a substrate having a germanium containing layer that is present on a dielectric layer, and etching the germanium containing layer of the substrate to provide a first region including a germanium containing fin structure and a second region including a mandrel structure. A first gate structure may be formed on the germanium containing fin structures. A III-V fin structure may then be formed on the sidewalls of the mandrel structure. The mandrel structure may be removed. A second gate structure may be formed on the III-V fin structure.

16 Claims, 4 Drawing Sheets

(56) References Cited

U.S. PATENT DOCUMENTS

| | | | |
|---|---|---|---|
| 8,207,027 B2* | 6/2012 | Zhu et al. | 438/176 |
| 8,264,032 B2* | 9/2012 | Yeh et al. | 257/327 |
| 8,551,841 B2* | 10/2013 | Lee et al. | 438/283 |
| 2004/0119100 A1* | 6/2004 | Nowak et al. | 257/204 |
| 2005/0121676 A1* | 6/2005 | Fried et al. | 257/72 |
| 2005/0124101 A1* | 6/2005 | Beintner | 438/197 |
| 2006/0091450 A1* | 5/2006 | Zhu et al. | 257/316 |
| 2007/0190708 A1* | 8/2007 | Kaneko et al. | 438/157 |
| 2008/0006852 A1* | 1/2008 | Beintner et al. | 257/255 |
| 2008/0099795 A1* | 5/2008 | Bernstein et al. | 257/255 |
| 2008/0296681 A1* | 12/2008 | Georgakos et al. | 257/347 |
| 2009/0057765 A1* | 3/2009 | Zhu et al. | 257/351 |
| 2009/0065853 A1* | 3/2009 | Hanafi | 257/327 |
| 2009/0230432 A1 | 9/2009 | Miyashita | |
| 2011/0068414 A1* | 3/2011 | Anderson et al. | 257/401 |
| 2013/0012025 A1* | 1/2013 | Cheng et al. | 438/696 |
| 2013/0161693 A1* | 6/2013 | Adam et al. | 257/192 |
| 2013/0249006 A1* | 9/2013 | Khakifirooz et al. | 257/368 |
| 2013/0270641 A1* | 10/2013 | Chi | 257/351 |
| 2013/0285141 A1* | 10/2013 | Kuo et al. | 257/347 |
| 2013/0292777 A1* | 11/2013 | Liaw | 257/369 |
| 2013/0307086 A1* | 11/2013 | Koburger et al. | 257/392 |
| 2014/0015015 A1* | 1/2014 | Krivokapic et al. | 257/288 |
| 2014/0061796 A1* | 3/2014 | Chang et al. | 257/347 |
| 2014/0061820 A1* | 3/2014 | Reznicek et al. | 257/401 |
| 2014/0106528 A1* | 4/2014 | Quyang et al. | 438/275 |
| 2014/0308781 A1* | 10/2014 | Basker et al. | 438/154 |

* cited by examiner

DUAL MATERIAL FINFET ON SAME SUBSTRATE

CROSS REFERENCE TO RELATED APPLICATION

This application is a continuation of U.S. patent application Ser. No. 13/887,766, filed May 6, 2013 the entire content and disclosure of which is incorporated herein by reference.

BACKGROUND

The present disclosure relates generally to semiconductor devices. More particularly, the present disclosure relates to semiconductor devices having a fin structure.

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties. In view of the possibility of scaling reaching its limits, other semiconductor geometries, such as fin field effect transistors (finFETs) have been considered.

SUMMARY

A method of fabricating a semiconductor device is provided that includes providing a substrate having a germanium containing layer that is present on a dielectric layer, and etching the substrate to provide a first region including a germanium containing fin structure and a second region including a mandrel structure. A first gate structure may be formed on the germanium containing fin structure. A III-V fin structures may then be formed on the sidewall of the mandrel structure. The mandrel structure may be removed. A second gate structure may be formed on the III-V fin structure.

In another aspect, a semiconductor device is provided. In one embodiment, the semiconductor device includes a substrate having a first device region and a second device region. The first device region may include a p-type fin field effect transistor including a first fin structure comprised of a germanium containing material. The second device region may include an n-type fin field effect transistor including second fin structure comprised of a III-V semiconductor material.

DESCRIPTION OF SEVERAL VIEWS OF THE DRAWINGS

The following detailed description, given by way of example and not intended to limit the present disclosure solely thereto, will best be appreciated in conjunction with the accompanying drawings, wherein like reference numerals denote like elements and parts, in which.

DETAILED DESCRIPTION

Figure 1:
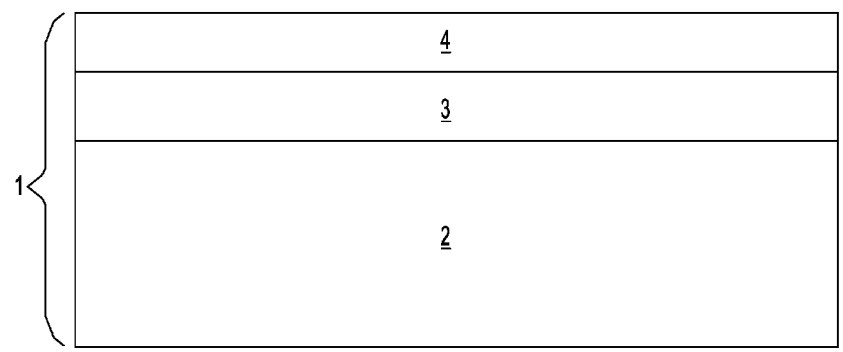
FIG. 1 is a side cross-sectional view of a semiconductor substrate having a germanium containing layer that is present on a dielectric layer, as used in accordance with one embodiment of the present disclosure.

Detailed embodiments of the methods and structures of the present disclosure are described herein; however, it is to be understood that the disclosed embodiments are merely illustrative of the disclosed methods and structures that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For the purposes of the description hereinafter, the terms "upper", "lower", "top", "bottom", and derivatives thereof shall relate to the disclosed structures, as they are oriented in the drawing figures.

The methods and structures disclosed herein provide fin structures, such as fin field effect transistors (finFETs). As used herein, the term "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. In some embodiments, the methods and structures disclosed herein provide a first conductivity finFET having a fin structure composed of a germanium containing material and a second conductivity finFET having a fin structure composed of a III-V semiconductor material on the same substrate. By "same substrate" it is meant that the first conductivity finFET, e.g., p-type finFET, and the second conductivity finFET, e.g., n-type finFET, are present simultaneously on the same substrate in different regions of the same substrate. Typically, the first conductivity finFET and the second conductivity finFET are present on a same surface, e.g., upper surface, of the semiconductor substrate.

FIGS. 1-6 depict one embodiment of a method of fabricating a first conductivity finFET 100a, e.g., p-type finFET, having a first fin structure 10 composed of a germanium containing material and a second conductivity finFET, e.g., n-type finFET 100b, having a second fin structure 20 composed of a III-V semiconductor material on the same substrate 5.

FIG. 1 depicts one embodiment of a semiconductor substrate 1 having a germanium containing layer 4 that is present on a dielectric layer 3, e.g., buried dielectric layer 3. In some embodiments, the semiconductor substrate 1 includes a germanium containing layer 4 that is present on a buried dielectric layer 3, wherein the buried dielectric layer 3 is present on a base semiconductor layer 2. The semiconductor substrate 1 may be a silicon germanium on insulator (SGOI) substrate or a germanium on insulator (GOI) substrate.

The germanium containing layer 4 may be composed of silicon germanium (SiGe). In some embodiments, the germanium containing layer 4 may be composed of silicon germanium (SiGe) or germanium (Ge). For example, the germanium containing layer 4 may be composed of up to 99 wt. % germanium. In one embodiment, the germanium containing layer 4 comprises from 1 wt. % germanium to 99 wt. % germanium. In another embodiment, the germanium containing layer 4 is composed of 10 wt. % to 50 wt. % germanium. In yet another embodiment, the germanium containing layer 4 is composed of 100 wt. % germanium.

The germanium containing layer 4 may be a single layer having a continuous distribution of germanium, or it may be a graded layer having a varying content of germanium included within different regions of the layer. The thickness of the germanium containing layer 4 may range from 5 nm to 5000 nm. In another embodiment, the germanium containing layer 4 may have a thickness that ranges from 20 nm to 200 nm.

The germanium containing layer 4 is typically present on, e.g., in direct contact with, a dielectric layer 3 (also referred to as a buried dielectric layer). The term "direct contact" means that a first element, such as a first structure, and a second element, such as a second structure, are connected without any intermediary conducting, insulating or semiconductor layers at the interface of the two elements. The dielectric layer 3 may be composed of an oxide, nitride or oxynitride material. For example, when the dielectric layer 3 is composed of an oxide, the dielectric layer 3 may be silicon oxide. In another example, when the dielectric layer is composed of a nitride, the dielectric layer 3 may be silicon nitride. The base semiconductor layer 2 may be a semiconducting material including, but not limited to Si, strained Si, SiC, SiGe, SiGeC, Si alloys, Ge, Ge alloys, GaAs, InAs, InP as well as other III/V and II/VI compound semiconductors.

In one embodiment, the semiconductor substrate 1 that is depicted in FIG. 1 may be formed by depositing the buried dielectric layer 3 on the base semiconductor layer 2 and then depositing the germanium containing layer 4 on the buried dielectric layer 3. The semiconductor substrate 1 depicted in FIG. 1 may also be formed by wafer bonding methods. In yet another embodiment, a germanium layer may be formed on the silicon on insulator (SOI) layer of a silicon on insulator (SOI) substrate. Thereafter, the germanium layer and the SOI layer of the SOI substrate may be annealed to thermally mix the germanium from the germanium containing layer with the silicon of the SOI layer to form the germanium containing layer 4 of the semiconductor substrate 1 that is depicted in FIG. 1.

Figure 2:
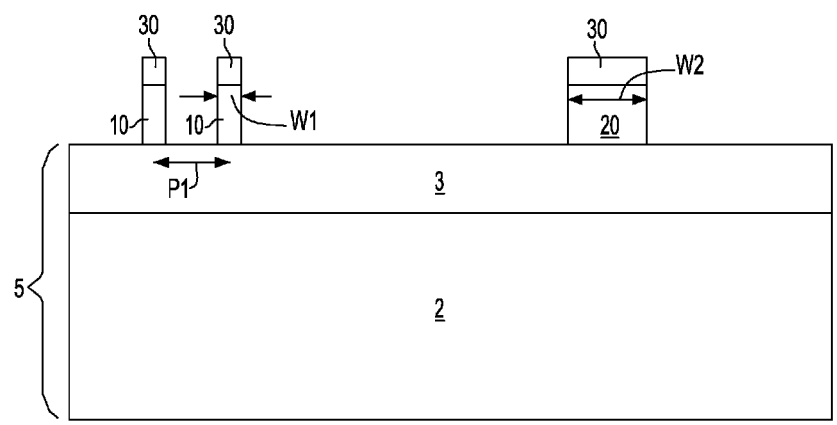
FIG. 2 is a side cross-sectional view depicting one embodiment of etching the semiconductor substrate to provide a first region including a germanium containing fin structure and a second region including a mandrel structure, in accordance with one embodiment of the present disclosure.

FIG. 2 is depicts one embodiment of etching the semiconductor substrate 1 to provide a first region including germanium containing fin structures 10 and a second region including a mandrel structure 20. More specifically, the germanium containing fin structures 10 and the mandrel structure 20 are typically formed from the germanium containing layer 4 of the semiconductor substrate 1. The term "mandrel" denotes a sacrificial structure that provides the deposition surface of a later formed fin structure for the second region of the substrate 5. The mandrel structure 20 typically has a width W2 that is larger than the width W1 of the germanium containing fin structures 10. For example, in one embodiment, the width W2 of the mandrel structure 20 may range from 15 nm to 45 nm, and the width W1 of each of the germanium containing fin structures 10 may range from 2 nm to 12 nm. In another embodiment, the width W2 of the mandrel structure 20 may range from 20 nm to 40 nm, and the width W1 of the germanium containing fin structures 10 may range from 5 nm to 10 nm.

In some embodiments, prior to etching the germanium containing layer 4, a dielectric cap layer 30 may be formed atop the germanium containing layer 4. The dielectric cap layer 30 may be composed of an oxide, nitride or oxynitride layer. For example, the dielectric cap layer 30 may be composed of silicon oxide or silicon nitride. The dielectric cap layer 30 may have a thickness ranging from 5 nm to 200 nm. In another embodiment, the dielectric cap layer 30 may have a thickness ranging from 10 nm to 100 nm. The dielectric cap layer 30 may be formed by a deposition or a forming method that is selected from the group consisting of chemical vapor deposition (CVD), chemical solution deposition, thermal growth, spin on deposition or a combination thereof.

Following the formation of the dielectric cap layer 30, the dielectric cap layer 30 and the germanium containing layer 4 of the semiconductor substrate 1 may be etched. In one embodiment, etching the dielectric cap layer 30 and the germanium containing layer 4 may include forming a patterned photoresist layer, i.e., photomask, on the dielectric cap layer 30, and over the germanium containing layer 4, and etching the dielectric cap layer 30 and the germanium containing layer 4 selectively to the photomask and the buried dielectric layer 3. In one embodiment, a pattern is produced by applying a photoresist to the surface to be etched, exposing the photoresist to a pattern of radiation, and then developing the pattern into the photoresist utilizing a resist developer. Once the patterning of the photoresist is completed, the sections of the dielectric cap layer 30 and the germanium containing layer 4 covered by the photoresist are protected to provide the germanium containing fin structures 10 and the mandrel structure 20, while the exposed regions are removed using a selective etching process. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater. In one embodiment, the etch chemistry is selected to remove at least one of the germanium containing layer 4 and the dielectric cap layer 30 selectively to the buried dielectric layer 3. The remaining portion of the semiconductor substrate 1 may now be referred to as a substrate 5, which has a dielectric upper surface provided by the buried dielectric layer 3.

In one embodiment, the etch process for forming the germanium containing fin structures 10 and the mandrel structure 20 is an anisotropic etch. An anisotropic etch process is a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation.

Each of the germanium containing fin structures 10 may have a height ranging from 5 nm to 200 nm. In one embodiment, each of the germanium containing fin structures 10 may have height ranging from 10 nm to 100 nm. In another embodiment, each of the germanium containing fin structures 10 may have a height ranging from 15 nm to 50 nm. Each of the germanium containing fin structures 10 may have a width $W_1$ ranging from 5 nm to 50 nm. In another embodiment, each of the germanium containing fin structures 10 may have width $W_1$ ranging from 8 nm to 20 nm. Adjacent germanium containing fin structures 10 may be separated by a pitch P1 ranging from 20 nm to 100 nm. In one embodiment, adjacent germanium containing fin structures 10 may be separated by a pitch P1 ranging from 30 nm to 50 nm.

Figure 3:
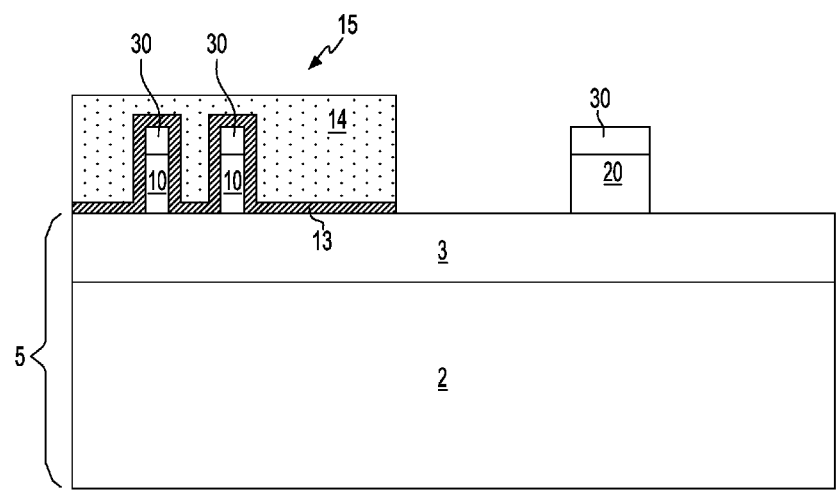
FIG. 3 is a side cross-sectional view depicting one embodiment of forming a first gate structure on the germanium containing fin structure, in accordance with the present disclosure.

FIG. 3 depicts one embodiment of forming a first gate structure 15 on the germanium containing fin structures 10. In one embodiment, the first gate structure 15 includes a first gate dielectric layer 13 and a first gate conductor layer 14. The first gate dielectric layer 13 is typically formed on the channel portion of the germanium containing fin structure 10.

The at least one first gate dielectric layer 13 of the first gate structure 15 may be composed of any dielectric material including oxides, nitrides and oxynitrides. In one embodiment, the at least one first gate dielectric layer 13 may be provided by a high-k dielectric material. The term "high-k" as used to describe the material of the at least one first gate dielectric layer 13 denotes a dielectric material having a dielectric constant greater than silicon oxide ($SiO_2$) at room temperature (20° C. to 25° C.) and atmospheric pressure (1 atm). For example, a high-k dielectric material may have a dielectric constant greater than 4.0. In another example, the high-k gate dielectric material has a dielectric constant greater than 7.0. In one embodiment, the at least one first gate dielectric layer 13 is composed of a high-k oxide, such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the at least one first gate dielectric layer 13 include hafnium silicate, hafnium silicon oxynitride or combinations thereof. In one embodiment, the at least one first gate dielectric 13 may be deposited by chemical vapor deposition (CVD). Variations of CVD processes suitable for depositing the at least one first gate dielectric layer 13 include, but are not limited to, APCVD, LPCVD, PECVD, MOCVD, ALD, and combinations thereof. In one embodiment, the thickness of the at least one first gate dielectric layer 13 is greater than 0.8 nm. More typically, the at least one first gate dielectric layer 13 has a thickness ranging from about 1.0 nm to about 6.0 nm.

The at least one first gate conductor layer 14 is formed on the at least one first gate dielectric layer 13. The at least one first gate conductor layer 14 may be formed by a deposition process, such as CVD, plasma-assisted CVD, plating, and/or sputtering, followed by planarization. In one embodiment, the at least one first gate conductor layer 14 is composed of metal or a doped semiconductor. Examples of metals that may be employed for the at least one first gate conductor layer 14 may include, but is not limited to, W, Ni, Ti, Mo, Ta, Cu, Pt, Ag, Au, Ru, Ir, Rh, and Re, Al, TiN, WN, TaN, TiAlN, TaAlN, and alloys thereof. One example of a doped semiconductor that is suitable for the at least one first gate conductor layer 14 is doped polysilicon.

In some embodiments, in which the first conductivity fin-FET that is formed in the first device region of the substrate 5 is a p-type finFET, the at least one first gate conductor layer 14 may include a metal that is a p-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero.

In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof. In one embodiment, the p-type work function metal layer comprising titanium nitride (TiN) may be deposited by a physical vapor deposition (PVD) method, such as sputtering. Examples of sputtering apparatus that may be suitable for depositing the p-type work function metal layer include DC diode type systems, radio frequency (RF) sputtering, magnetron sputtering, and ionized metal plasma (IMP) sputtering. In addition to physical vapor deposition (PVD) techniques, the p-type work function metal layer may also be formed using chemical vapor deposition (CVD) and atomic layer deposition (ALD).

The at least one first gate structure 15 may be formed using deposition, photolithography and etch processes. The at least one first gate structure 15 is formed on a channel portion of the at least one germanium containing fin structure 10. For example, the material layers for the at least one first gate dielectric layer 13 and the at least one gate conductor layer 14 may be deposited onto the silicon germanium fin structures 10 to provide a gate stack. Thereafter, the gate stack may be patterned and etched to provide the at least one first gate structure 15.

Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections of the stack of the at least one gate dielectric layer 13 and the at least one gate conductor layer 14 covered by the photoresist are protected to provide the at least one first gate structures 15, while the exposed regions are removed using a selective etching process that removes the unprotected regions. For example, the portion of the at least one first gate dielectric layer 13 and the at least one first gate conductor layer 14 that is present over the second region of the substrate 5 including the mandrel structure 20 may be removed. Following formation of the at least one first gate structure 15, the photoresist may be removed.

Figure 4:
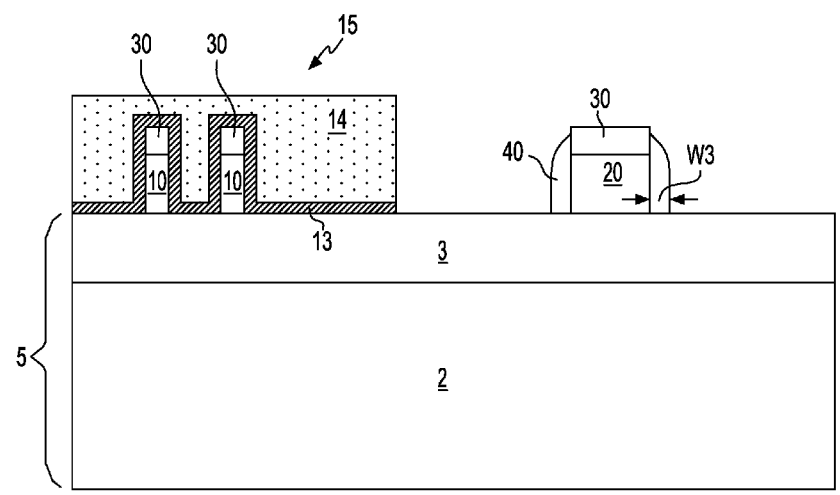
FIG. 4 is a side cross-sectional view depicting forming a III-V fin structure on a sidewall of the mandrel structure, in accordance with one embodiment of the present disclosure.

FIG. 4 depicts one embodiment of forming III-V fin structures 40 on the sidewalls of the mandrel structure 20. The term "III-V semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors that can be used in the present invention include, but are not limited to alloys of gallium arsenic (GaAs), aluminum arsenic (AlAs), indium gallium arsenic (InGaAs), indium aluminum arsenic (InAlAs), indium aluminum arsenic antimony (InAlAsSb), indium aluminum arsenic phosphorus (InAlAsP), indium gallium arsenic phosphorus (InGaAsP) and combinations thereof.

In some embodiments, the III-V fin structures 40 may be formed on the mandrel structure 20 using an epitaxial deposition process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon oxide or silicon nitride surfaces. Therefore, in some embodiments, because the epitaxially grown III-V fin structures 40 are not formed on dielectric structures, such as the dielectric cap layer 30, or the dielectric layer that is present on the at least one first gate structure 15, the epitaxially grown III-V fin structures 40 are selectively deposited on the sidewalls of the mandrel structure 20. The sidewalls of the mandrel structure 20 are composed of a semiconductor material, such as germanium or silicon germanium.

Examples of various epitaxial growth process apparatuses that are suitable for use with the present disclosure include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the III-V fin structures 40 typically range from 550° C. to 900° C. Although higher temperature typically results in faster deposition, the faster deposition may result in crystal defects and film cracking.

In one embodiment, each of the III-V fin structures 40 may have a width W3 ranging from 2 nm to 30 nm. In another embodiment, each of the III-V fin structures 40 may have a width W3 ranging from 5 nm to 15 nm.

Figure 5:
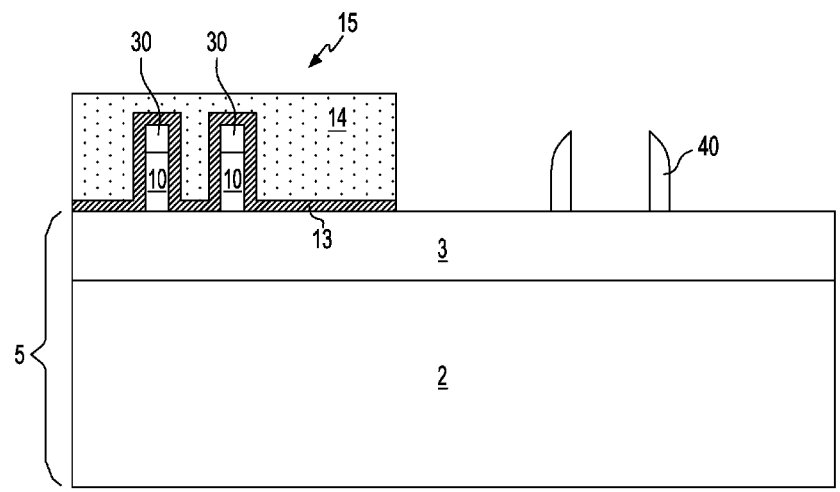
FIG. 5 is a side cross-sectional view depicting one embodiment of removing the mandrel structure.

FIG. 5 depicts one embodiment of removing the mandrel structure 20. In one embodiment, the mandrel structure 20 is removed by an etch that is selective to the III-V fin structures 40. The etch for removing the mandrel structure 20 may also be selective to the at least one first gate structure 15. In some examples, the dielectric cap layer 30 and the dielectric layer that is present on the at least one first gate structure 15 can be removed before removing the mandrel structure 20. In one embodiment, the etch process for removing the mandrel structure 20 may be an anisotropic etch, such as reactive ion etch (RIE), or the etch process may be an isotropic etch, such as a wet chemical etch. In one example, a wet etch composed of $H_3PO_4$ may be used to remove a dielectric cap layer 30 composed of silicon nitride, and a wet etch composed of $NH_4/H_2O_2$ may be used to remove a mandrel structure 20 composed of germanium. In one embodiment, the process of removing the mandrel structure 20 and the dielectric cap layer 30 includes patterning a photoresist layer to cover the region of the substrate 5 that corresponds to the p-type semiconductor devices, and removing the dielectric cap layer 30 with a wet etch of hydrofluoric (HF) acid that is selective to oxide or a reactive ion etch process. Thereafter, the patterned photoresist layer is removed from the region of the substrate corresponding to the p-type semiconductor devices and another patterned photoresist layer is formed over the portion of the substrate corresponding to the n-type semiconductor devices, in which at least the mandrel structure 20 is exposed. The exposed mandrel structure 20 is then removed using a selective wet etch or plasma etch, such as $XeF_2$.

Figure 6A:
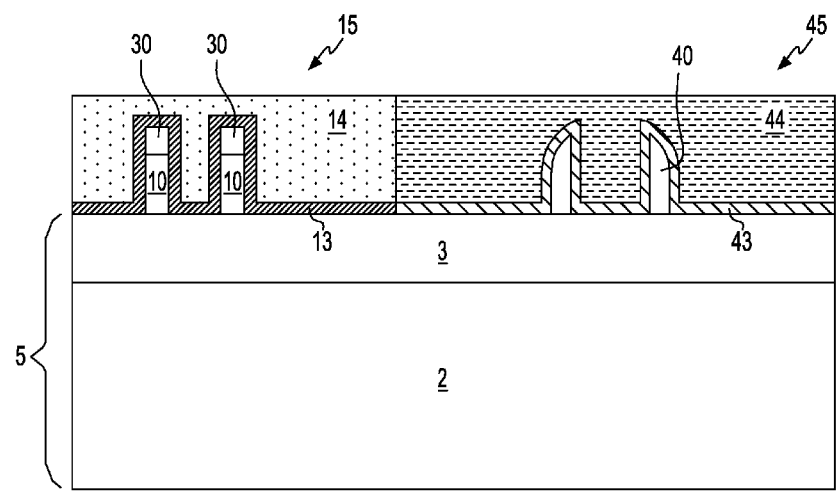
FIG. 6A is a side cross-sectional view depicting forming a second gate structure on the III-V fin structure, in accordance with the present disclosure.
Figure 6B:
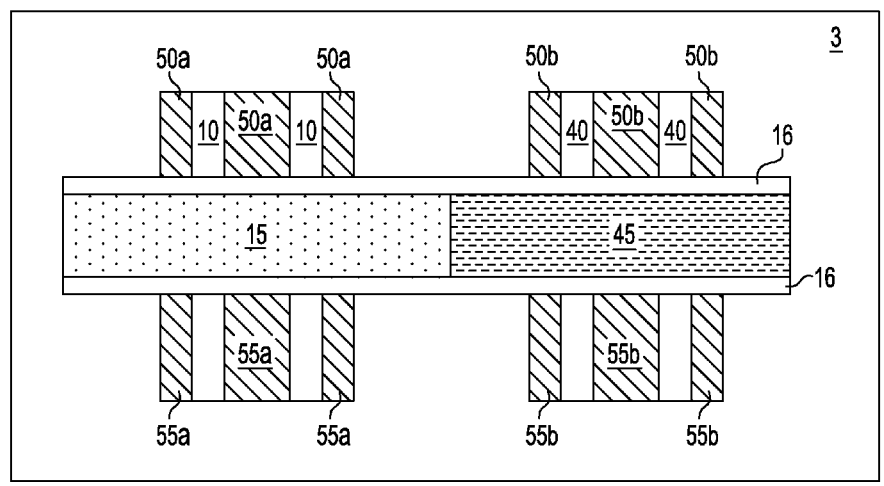
FIG. 6B is a top down planar view of the structure depicted in FIG. 6A.

FIG. 6 depicts forming a second gate structure 45 on the III-V fin structures 40. In one embodiment, the second gate structure 45 includes at least one second gate dielectric layer 43 and at least one second gate conductor layer 44. The at least one second gate dielectric layer 43 is typically formed on the channel portion of the III-V fin structure 40. The at least one second gate dielectric layer 43 of the second gate structure 45 may be composed of any dielectric material including oxides, nitrides and oxynitrides. In one embodiment, the at least one second gate dielectric layer 43 may be provided by a high-k dielectric material. In one embodiment, the at least one second gate dielectric layer 43 is composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the at least one second gate dielectric layer 43 include hafnium silicate, hafnium silicon oxynitride or combinations thereof. In one embodiment, the at least one second gate dielectric layer 43 may be deposited by chemical vapor deposition (CVD). Variations of CVD processes suitable for depositing the at least one second gate dielectric layer 43 include, but are not limited to, APCVD, LPCVD, PECVD, MOCVD, ALD, and combinations thereof. In one embodiment, the thickness of the at least one second gate dielectric layer 43 is greater than 0.8 nm. More typically, the at least one second gate dielectric layer 43 has a thickness ranging from about 1.0 nm to about 6.0 nm.

The at least one second gate conductor layer 44 is formed on the at least one second gate dielectric layer 43. The at least one second gate conductor layer 44 may be formed by a deposition process, such as CVD, plasma-assisted CVD, plating, and/or sputtering, followed by planarization. In one embodiment, the at least one second gate conductor layer 44 is composed of metal or a doped semiconductor. Examples of metals that may be employed for the at least one second gate conductor layer 44 may include, but is not limited to, W, Ni, Ti, Mo, Ta, Cu, Pt, Ag, Au, Ru, Ir, Rh, and Re, Al, TiN, WN, TaN, TiAlN, TaAlN, and alloys thereof. One example of a doped semiconductor that is suitable for the at least one second gate conductor layer 44 is doped polysilicon.

In some embodiments, in which the first conductivity finFET that is formed in the second device region of the substrate 5 is an n-type finFET, the at least one second gate conductor layer 44 may include a metal that is an n-type work function metal layer. As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is composed of at least one of TiAl, TanN, TiN, HfN, HfSi, or combinations thereof. The n-type work function metal layer can be deposited using chemical vapor deposition (CVD), atomic layer deposition (ALD), sputtering or plating. In one embodiment, the n-type work function metal layer is composed of titanium aluminum (TiAl) and is deposited using sputtering. Examples of sputtering apparatus that may be suitable for depositing the n-type work function metal layer include DC diode type systems, radio frequency (RF) sputtering, magnetron sputtering, and ionized metal plasma (IMP) sputtering. In one example, an n-type work function metal layer composed of TiN is sputtered from a solid titanium target, in which the nitrogen content of the metal nitride layer is introduced by a nitrogen gas. In another example, an n-type work function metal layer composed of TiN is sputtered from a solid target comprised of titanium and nitrogen. In addition to physical vapor deposition (PVD) techniques, the n-type work function metal layer may also be formed using chemical vapor deposition (CVD) and atomic layer deposition (ALD). The at least one second gate structure 44 may be formed using deposition, photolithography and etch processes.

Following the formation of the second gate structure 45, source regions 50a, 50b and drain regions 55a, 55b may be formed on the germanium containing fin structures 10 and the III-V fin structures 40. In some embodiments, the process sequence for forming the source regions 50a, 50b and drain regions 55a, 55b includes forming a spacer 16 on a sidewall of the gate structure 15, 45, and forming the source regions 50a, 50b and drain regions 55a, 55b on opposing sides of the gate structure 15, 45. In some examples, the exposed portions of the germanium containing fin structures 20 and the exposed portions of the III-V fin structures 40 may be doped to provide source and drain extension regions. The source and drain extension regions formed in the germanium containing fin structures 10 may be p-type doped to provide a p-type conductivity fin field effect transistor. The source and drain extension regions to the III-V fin structures 40 may be n-type doped to provide an n-type conductivity fin field effect transistor.

Following the formation of the source and drain extension regions, epitaxially formed source regions 50a, 50b and drain regions 55a, 55b may be formed on the germanium containing fin structures 10 and the III-V fin structures 40. The epitaxially formed source regions 50a, 50b and drain regions 55a, 55b have a conductivity that is typically similar to the conductivity of the source and drain extension regions. For example, the epitaxially formed source regions 50a and drain regions 55a that are formed on the germanium containing fin structure 10 may be doped to a p-type conductivity to provide a p-type finFET device. The epitaxially formed source regions 50b and drain regions 55b that are formed on the III-V fin structure 40 may be doped to an n-type conductivity to provide an n-type finFET device.

FIGS. 1-6B depict a gate first process. In another embodiment, the process sequence for forming finFET devices including the germanium containing fin structures 10 and the III-V fin structures 40 includes a gate last process sequence, which is not depicted in the supplied figures. A gate last process includes forming a replacement gate structure on the channel portion of the fin structures, e.g., germanium containing fin structures 10 and III-V fin structures 40, forming a spacer on the sidewall of the replacement gate structure, forming source and drain regions on opposing sides of the replacement gate structure, removing the replacement gate structure, and forming a functional gate structure in the space once occupied by the replacement gate structure. The replacement gate structure can include sacrificial material that defines the geometry of a later formed functional gate structure that functions to switch the semiconductor device from an "on" to "off" state, and vice versa. A process sequence employing a replacement gate structure may be referred to as a "gate last" process sequence. Both gate first and gate last process sequences are applicable to the present disclosure.

In another aspect, the present disclosure provides a semiconductor device that includes a substrate 5 having a first device region and a second device region. In one embodiment, a p-type fin field effect transistor 100a is present in the first device region. The p-type fin field effect transistor 100a includes a first fin structure comprised of a germanium containing material, i.e., germanium containing fin structure 10. In one embodiment, an n-type fin field effect transistor is simultaneously present in the second device region. The n-type fin field effect transistor includes a second fin structure comprised of III-V semiconductor material, i.e., III-V fin structure 40.

While the present disclosure has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor device comprising:
a p-type fin field effect transistor located in a first device region, wherein the p-type fin field effect transistor includes a first fin structure comprised of a germanium containing material and has a bottommost surface in direct physical contact with a first portion of a topmost surface of an insulator layer; and
an n-type fin field effect transistor located in a second device region, wherein the n-type fin field effect transistor includes a second fin structure comprised of III-V semiconductor material and has a bottommost surface in direct physical contact with a second portion of the topmost surface of the insulator layer, wherein the second fin structure has a different shape than the first fin structure and has a first sidewall surface that is entirely perpendicular to the topmost surface of the insulator layer, and a second sidewall surface that has a lower portion that is entirely perpendicular to the topmost surface of the insulator layer and an upper portion that is not perpendicular to the topmost surface of the insulator layer, wherein a high-k gate dielectric of said n-type field effect transistor is in direct physical contact with an entirety of the first sidewall surface and the second sidewall surface of said second fin structure.

2. The semiconductor device of claim 1, wherein the insulator layer is selected from the group consisting of silicon oxide, silicon nitride, silicon oxynitride, boron nitride, aluminum oxide and combinations thereof.

3. The semiconductor device of claim 1, wherein the germanium containing material of the first fin structure is selected from the group consisting of germanium (Ge), silicon germanium (SiGe), and combinations thereof.

4. The semiconductor device of claim 1, wherein the III-V semiconductor material of the second fin structure is selected from the group consisting of gallium arsenic (GaAs), aluminum arsenic (AlAs), indium gallium arsenic (InGaAs), indium aluminum arsenic (InAlAs), indium aluminum arsenic antimony (InAlAsSb), indium aluminum arsenic phosphorus (InAlAsP), indium gallium arsenic phosphorus (InGaAsP) and combinations thereof.

5. The semiconductor device of claim 1, wherein the p-type fin field effect transistor includes a high-k gate dielectric selected from the group consisting of $HfO_2$, $ZrO_2$, $Al_2O_3$, $TiO_2$, $La_2O_3$, $SrTiO_3$, $LaAlO_3$, $Y_2O_3$ and combinations thereof.

6. The semiconductor device of claim 1, wherein the p-type fin field effect transistor includes a first a titanium nitride first gate conductor.

7. The semiconductor device of claim 1, wherein the high-k gate dielectric of the n-type fin field effect transistor is selected from the group consisting of HfO$_2$, ZrO$_2$, Al$_2$O$_3$, TiO$_2$, La$_2$O$_3$, SrTiO$_3$, LaAlO$_3$, Y$_2$O$_3$ and combinations thereof.

8. The semiconductor device of claim 1, wherein the n-type fin field effect transistor includes a titanium nitride second gate conductor.

9. The semiconductor device of claim 1, wherein a spacer is present on sidewalls of a gate structure of said p-type fin field effect transistor and a gate structure of said n-type fin field effect transistor.

10. The semiconductor device of claim 9, further comprising source regions and drain regions on opposing sides of said gate structures.

11. The semiconductor device of claim 1, wherein a bottommost surface of the insulator layer is in direct physical contact with a base semiconductor layer.

12. The semiconductor device of claim 1, wherein the insulator layer is located entirely beneath said first fin structure and said second fin structure.

13. A semiconductor device comprising:
a substrate comprising an insulator layer and having a first device region and a second device region;
a p-type fin field effect transistor in the first device region, wherein the p-type fin field effect transistor includes a first fin structure having a planar topmost surface and comprised of a germanium containing material; and
an n-type fin field effect transistor in the second device region, wherein the n-type fin field effect transistor includes a second fin structure having a spacer shape with a non-planar topmost surface and comprised of III-V semiconductor material, wherein the second fin structure has a different shape than the first fin structure and has a first sidewall surface that is entirely perpendicular to a topmost surface of the insulator layer, and a second sidewall surface that has a lower portion that is entirely perpendicular to the topmost surface of the insulator layer and an upper portion that is not perpendicular to the topmost surface of the insulator layer, wherein a high k gate dielectric of said n-type field effect transistor is in direct physical contact with an entirety of the first sidewall surface and the second sidewall surface of said second fin structure.

14. The semiconductor device of claim 13, wherein the insulator layer is selected from the group consisting of silicon oxide, silicon nitride, silicon oxynitride, boron nitride, aluminum oxide and combinations thereof.

15. The semiconductor device of claim 13, wherein the germanium containing material of the first fin structure is selected from the group consisting of germanium (Ge), silicon germanium (SiGe), and combinations thereof.

16. The semiconductor device of claim 13, wherein the III-V semiconductor material of the second fin structure is selected from the group consisting of gallium arsenic (GaAs), aluminum arsenic (AlAs), indium gallium arsenic (InGaAs), indium aluminum arsenic (InAlAs), indium aluminum arsenic antimony (InAlAsSb), indium aluminum arsenic phosphorus (InAlAsP), indium gallium arsenic phosphorus (InGaAsP) and combinations thereof.

* * * * *